US010317943B2

(12) United States Patent
Lee et al.

(10) Patent No.: US 10,317,943 B2
(45) Date of Patent: Jun. 11, 2019

(54) PLACEMENT OF ADHESIVE IN DISPLAY DEVICE

(71) Applicant: Microsoft Technology Licensing, LLC, Redmond, WA (US)

(72) Inventors: Jason Fergus Lee, Redmond, WA (US); Kenneth Charles Boman, Duvall, WA (US); James Michael Bonicatto, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 69 days.

(21) Appl. No.: 15/147,702

(22) Filed: May 5, 2016

(65) Prior Publication Data
US 2017/0322595 A1    Nov. 9, 2017

(51) Int. Cl.
| B32B 7/06 | (2019.01) |
| G06F 1/16 | (2006.01) |
| B29C 65/00 | (2006.01) |
| H01L 21/683 | (2006.01) |

(52) U.S. Cl.
CPC ............ *G06F 1/1637* (2013.01); *B29C 66/90* (2013.01); *B29C 66/97* (2013.01); *B32B 7/06* (2013.01); *G06F 1/1656* (2013.01); *H01L 21/6835* (2013.01)

(58) Field of Classification Search
CPC .............................. G06F 1/1637; G06F 1/1656
USPC ................................. 156/247, 249, 350, 378
See application file for complete search history.

(56) References Cited

U.S. PATENT DOCUMENTS

| 4,812,830 A | 3/1989 | Doering |
| 5,164,542 A * | 11/1992 | Hart ...................... G06F 1/1626 174/383 |
| 5,221,642 A | 6/1993 | Burns |
| 5,375,005 A | 12/1994 | Komano |
| 6,380,497 B1 | 4/2002 | Hashimoto et al. |
| 6,555,235 B1 | 4/2003 | Aufderheide et al. |
| 7,675,589 B2 | 3/2010 | Kurasawa |
| 7,697,281 B2 | 4/2010 | Dabov et al. |

(Continued)

FOREIGN PATENT DOCUMENTS

EP    0407108 A1    1/1991

OTHER PUBLICATIONS

Written Opinion of PCT/US2017/0129997.*

(Continued)

*Primary Examiner* — Sonya M Sengupta
(74) *Attorney, Agent, or Firm* — Alleman Hall Creasman & Tuttle LLP (57) ABSTRACT

Examples are disclosed that relate to aligning a pressure sensitive adhesive to a body of a display device for attachment of a display module to the display device. One example provides an electronic display device comprising a body, the body comprising a wall and a deck extending inwardly from the wall. The deck comprises a first reference feature configured to interface with a first index feature on a pressure sensitive adhesive application fixture, and a second reference feature configured to interface with a second index feature on the pressure sensitive adhesive application fixture. The electronic display device further comprises a display module supported by the deck, and a pressure sensitive adhesive adhering the display module to the deck.

7 Claims, 7 Drawing Sheets

(56) References Cited

U.S. PATENT DOCUMENTS

| | | | |
|---|---|---|---|
| 8,408,780 B2 | 4/2013 | Mathew et al. | |
| 8,416,351 B2 | 4/2013 | Liu et al. | |
| 8,610,822 B2 | 12/2013 | Weber et al. | |
| 8,724,297 B2 | 5/2014 | Tho | |
| 2008/0230177 A1* | 9/2008 | Crouser | G02F 1/133502 |
| | | | 156/275.5 |
| 2011/0285926 A1 | 11/2011 | Yokote et al. | |
| 2013/0141688 A1 | 6/2013 | Wang | |
| 2014/0111927 A1 | 4/2014 | Raff | |
| 2014/0152890 A1 | 6/2014 | Rayner | |
| 2015/0277179 A1 | 10/2015 | Nishi et al. | |
| 2015/0277502 A1 | 10/2015 | Witham et al. | |

OTHER PUBLICATIONS

Search Strategy for PCT/US17/29997.*
"Removing and replacing the touchscreen for HP OMEN 15 Notebook PC", Retrieved on: Feb. 15, 2016 Available at: http://h20564.www2.hp.com/hpsc/doc/public/display?docId=c04517207.
"International Search Report and Written Opinion Issued in PCT Application No. PCT/US2017/029997", dated Oct. 26, 2017, 12 Pages.

* cited by examiner

PLACEMENT OF ADHESIVE IN DISPLAY DEVICE

BACKGROUND

An electronic display device, such as a tablet, mobile phone, or laptop computer, may include a display module incorporated into a body of the display device to display content on the display device.

SUMMARY

Examples are disclosed that relate to aligning a pressure sensitive adhesive to a body of a display device for attachment of a display module to the display device. One example provides an electronic display device comprising a body, the body comprising a wall and a deck extending inwardly from the wall. The deck comprises a first reference feature configured to interface with a first index feature on a pressure sensitive adhesive application fixture, and a second reference feature configured to interface with a second index feature on the pressure sensitive adhesive application fixture. The electronic display device further comprises a display module supported by the deck, and a pressure sensitive adhesive adhering the display module to the deck.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
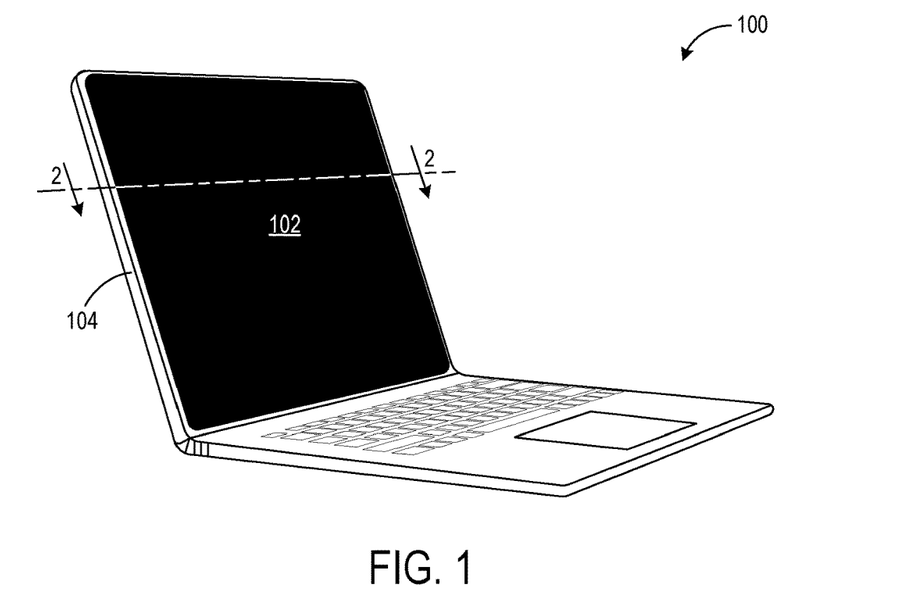
FIG. 1 shows an example display device having a display module.

A display module for displaying content may be attached to a computing device body via an adhesive, such as a pressure-sensitive adhesive. To support the display module, the body may include an inwardly extending deck to which the display module is adhered. FIG. 1 shows an example electronic display device 100 including a display module 102 and a body 104 holding the display module 102.

Figure 2:
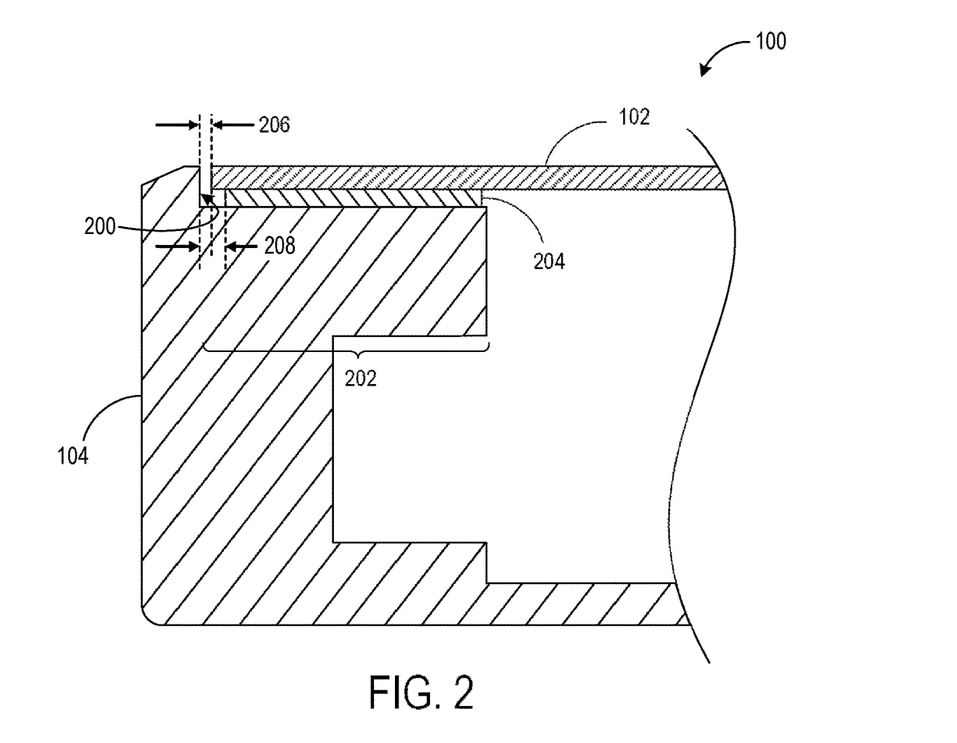
FIG. 2 shows a partial cross section view of the example device of FIG. 1 taken along line 2-2 of FIG. 1.

FIG. 2 shows a partial cross-section of the example electronic display device 100, illustrating the display module 102 positioned within the body 104. Other internal components are omitted for clarity. The body 104 comprises a protective wall 200, and a deck 202 extending inwardly from the wall 200. The display module 102 is adhered to the deck 202 such that the wall at least partially surrounds the display module 102. The display module 102 may comprise a plurality of layers, such as two electrode layers separated by a dielectric layer in some examples, but is depicted herein as a single layer. The display module 102 may also include a touch detection component, such as one or more sensor layers, in examples where the display device 100 is also a touch-sensitive display device.

As mentioned above, the display module 102 may be adhered to the deck using a pressure-sensitive adhesive (PSA) 204. Placement of the PSA 204 onto the deck for attachment of the display module 102 may pose challenges. For example, a PSA placement fixture in an assembly process may not directly reference the PSA 204 to the body 104 and/or the deck 202. Instead, the PSA placement fixture may reference a different portion of the fixture that holds the body. As a result, the tolerance stackup, which represents accumulated variations allowed by specified part and placement tolerances, may include tolerances for the placement of the PSA on the fixture, for the placement of the body on the fixture, for the dimensions of the PSA and body component parts, and for the alignment of the PSA fixture component to the body fixture component, as examples. In some instances, the tolerance stackup for the placement of the display module on the body of device 100 may result in a PSA placement accuracy of +/−0.3 mm.

Misalignment of the PSA may affect adhesion performance and/or have visible effects on the device 100. For example, continuing with FIG. 2, a small gap 206 is located between an outer edge of the display module 102 and the wall 200. If the PSA 204 is placed too close to the wall 200, the PSA 204 may extend beyond the outer edge of the display module 102 such that it is visible through the gap 206. Dust may adhere to the PSA 204 in the gap 206 as well, which also may be visible. Thus, to avoid such effects, the PSA 204 may be configured not to extend into the gap 206 even at a maximum of the tolerance range. FIG. 2 shows, for example, a designed-in tolerance gap 208 between the PSA 102 and the wall 200 of the body 104 to account for the placement accuracy range of the PSA 204. However, the use of the tolerance gap 208 may result in an outer edge of the display module 102 extending beyond an outer edge of the PSA 204 by an average of approximately 0.3 mm, and by as much as 0.6 mm at the other end of the tolerance range.

Accordingly, examples are disclosed that may help to reduce a magnitude of the tolerance stackup in a PSA application process. Briefly, the disclosed methods utilize a PSA application fixture that directly references a deck of a body of a display device when placing the PSA on the deck. Directly referencing fixture to the deck may help to tighten the tolerance stackup compared to methods in which such direct referencing is not used. In some examples, the disclosed examples may allow a tolerance of 0.10-0.25 mm to be achieved.

Figure 3:
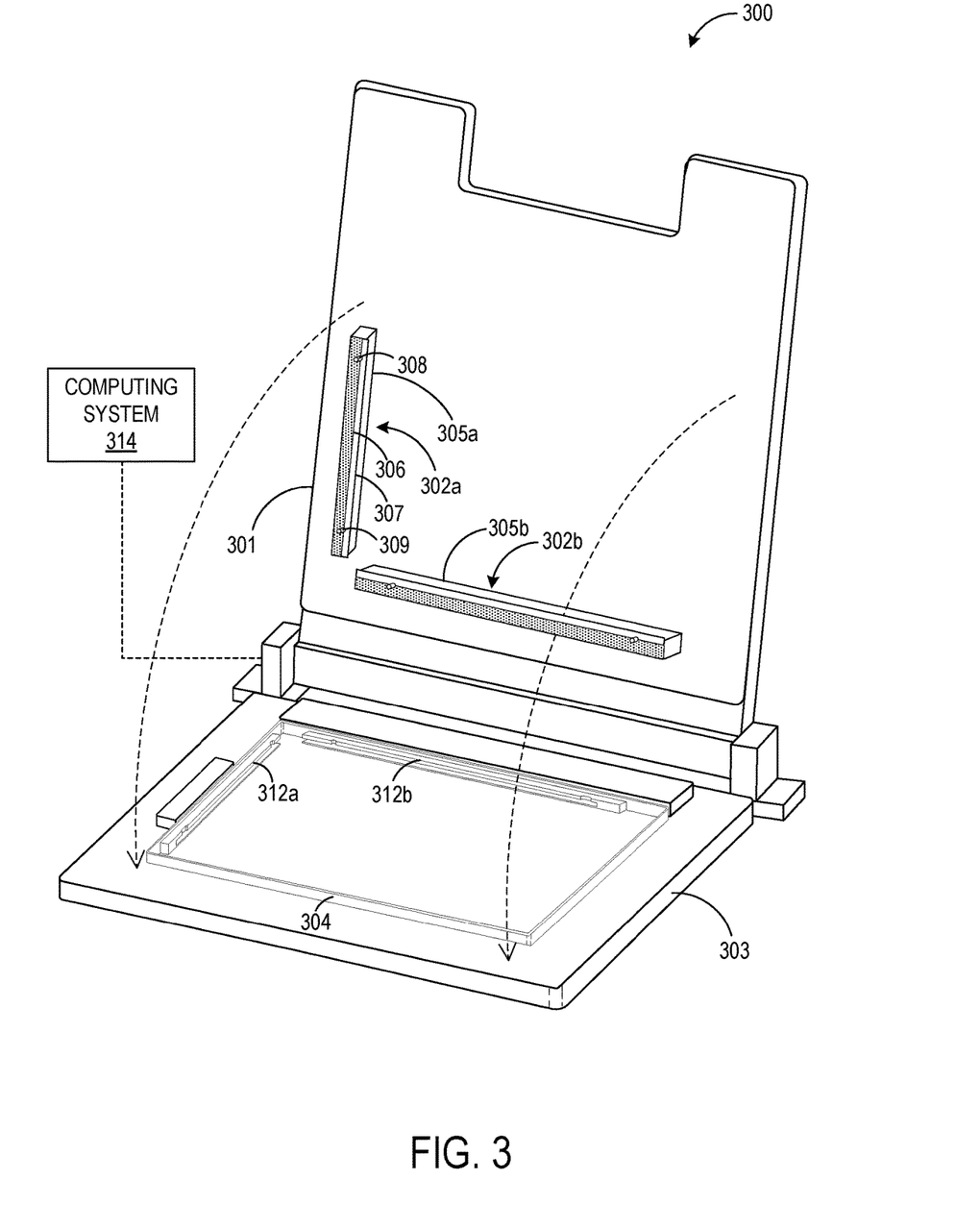
FIG. 3 shows a perspective view of an example pressure sensitive adhesive application fixture for aligning and adhering a pressure sensitive adhesive to a body of a display device.

FIG. 3 shows an example PSA application fixture 300 in the form of a clamshell structure having a PSA-applicator portion 301 to hold PSA assemblies 302a and 302b, and a body-supporting portion 303 to hold a device body 304. The PSA-applicator portion 301 includes PSA holding features 305a and 305b. Other examples may have either more or fewer PSA holding features. Each PSA holding feature 305 is configured to hold a strip-shaped PSA assembly to the fixture 300 by vacuum or in any other suitable manner for application to a corresponding side of the body 304. For example, the PSA holding feature 305a is shown holding PSA assembly 302a, and the PSA holding feature 305b is shown holding PSA assembly 302b. The PSA assembly 302a includes a PSA 306 on one side and a releasable support 307 on the other side, with the side having the releasable support 307 held to the PSA application fixture 300. The PSA assembly 302b is similarly configured. In other examples, a PSA holding feature may be configured to hold a PSA assembly of any other suitable shape than a strip shape.

Each PSA holding feature includes a vacuum head comprising a plurality of holes to draw a vacuum for holding a PSA assembly to the PSA holding feature. This is described in more detail below with regard to FIG. 4A. Each PSA holding feature further includes index features for interfacing with corresponding reference features on the body 304, as shown at 308 and 309 for the PSA holding feature 305a. Various mechanical features not depicted in FIG. 3 (e.g. motors, controllers, etc.) may be included to control the movement of parts of the PSA application fixture 300 during a PSA application process.

The fixture 300 is shown in FIG. 3 in an open configuration. In this configuration, the PSA assemblies 302a and 302b may be placed on the PSA holding features 305a and 305ba, and a vacuum applied to hold the PSA assemblies in place. Further, the body 304 may be placed on the body-supporting portion 303 of the PSA application fixture 300. The PSA application fixture 300 then may be rotated on a hinge to move the PSA assemblies 302a and 302b closer toward a deck 312 of the body 304 such that the PSA assembly 302a moves toward a first side 312a of the body 304 and the PSA assembly 302b moves toward a second side 312b of the body 304, as indicated schematically by the dotted arrows. Movements of parts of the PSA application fixture 300, application/release of vacuum, and/or other functions of the PSA application fixture may be controlled by a computing system 314, described in more detail with regard to FIG. 10.

Figure 4A:
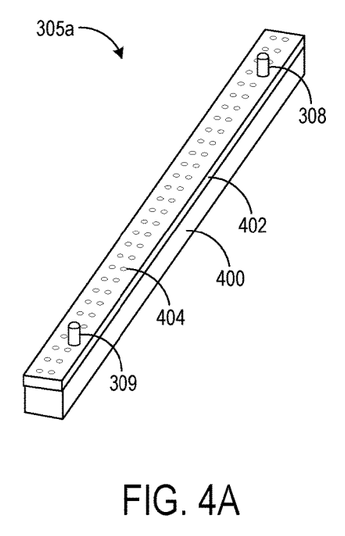
FIG. 4A shows a perspective view of a portion of the pressure sensitive adhesive application fixture of FIG. 3.
Figure 4B:
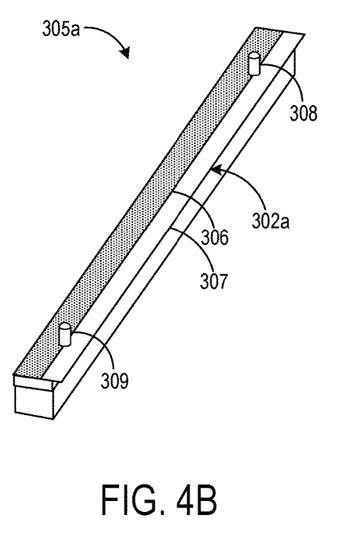
FIG. 4B shows a pressure sensitive adhesive assembly held on the fixture.

FIG. 4A shows a magnified view of the PSA holding feature 305a, and FIG. 4B shows the PSA holding feature 305a with the PSA assembly 302a held thereto. The PSA holding feature 305a includes a frame 400 and a vacuum head 402 having a plurality of holes 404 through which a vacuum may be applied to the releasable support 307 of the PSA assembly 302a. In other examples, the PSA assembly 306 may be held in place by a mechanism other than via a vacuum, such as a mechanical clasp.

As mentioned above, the PSA holding feature 305a includes a first index feature 308 and a second index feature 309 configured to directly reference respective features in the deck 312 of the body 304 to help align the PSA assembly 302a to the body 304. The PSA assembly 302a may be cut from a longer PSA strip using a cutting die manufactured with a desired degree of accuracy. The die cutting of the PSA assembly 302a may form holes in the PSA assembly 302a corresponding to the locations of the first index feature 308 and the second index feature 309. This may allow a positional tolerance of the PSA assembly 302a on the PSA holding feature 305a to be maintained at a desired level. Then, the PSA assembly 302a may be placed onto the deck 312 of a device body by directly referencing the first index feature 308 and the second index feature 309 to the device body 304. Thus, the tolerance stackup for the placement of the PSA using such direct referencing of the fixture to the device body may include tolerances for the dimensions of the PSA and for the reference features formed within the body, which is a lesser number of components than the tolerance stackup for the fixture-to-fixture referencing described above. This may help to achieve a relatively tighter tolerance for PSA placement, and thus may allow the use of a smaller built-in tolerance gap for the PSA. The first and second index features 308, 309 are shown in FIGS. 3, 4A and 4B as alignment pins, though they may take any other suitable form(s).

Figure 5:
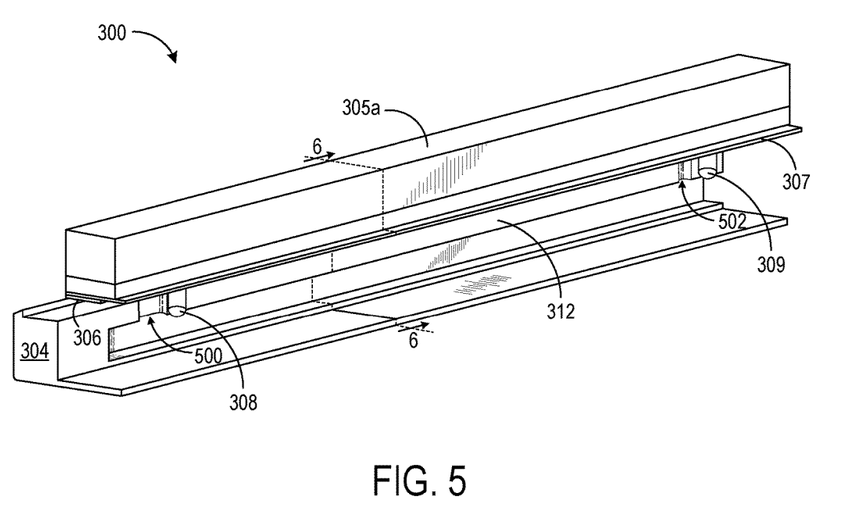
FIG. 5 shows a perspective view of a portion of the pressure sensitive adhesive application fixture of FIG. 3 in a first, unaligned position and also shows a cutaway portion of a device body.

FIG. 5 shows a partial perspective view of the PSA holding feature 305a having been rotated to a first position relative to the device body by closure of the clamshell structure of the PSA application fixture 300. Other portions of the PSA application fixture 300 are omitted from this figure for clarity. In this configuration, the first index feature 308 and the second index feature 309 have not yet contacted the body 304, and the PSA 306 has not yet been applied to the deck. As shown, the first index feature 308 on the PSA application fixture 300 is configured to interface with a first, "rotational" reference feature 500 of the body 304, where the first reference feature 500 is an elongated indentation formed in an inner edge of the deck 312. Likewise, the second index feature 309 is configured to interface with a second, "translation-fixing" reference feature 502 of the body 304, where the second reference feature 502 is a semicircular indentation also formed in the inner edge of the deck 312 with a shape that accurately matches the shape of the second index feature 309. The first reference feature 500 may allow an initial reference point to be established and maintained with the inner edge of the deck 312 via the first index feature 308. Once this initial reference point is established, the second index feature 309 is then moved into the second reference feature 502 via rotation about the first index feature 308 and possibly translation of the first index feature 308 within the first reference feature 500. Placement of the second index feature 309 within the second reference feature 502 limits both further rotation and translation. As such, once both the first and second index features 308, 309 are respectively placed into the first and second reference features 500 and 502, the PSA 306 is positioned relative to the deck 312 at a desired accuracy. While shown here as ellipsoidal indentations, it will be understood that each of reference features 500 and 502 may take any other suitable form, such as an indentation comprising one or more angles, e.g. a triangular-shaped or rectangular-shaped cutout, as non-limiting examples. Further, in some examples, the reference features 500 and 502 may have the same configuration.

Figure 6:
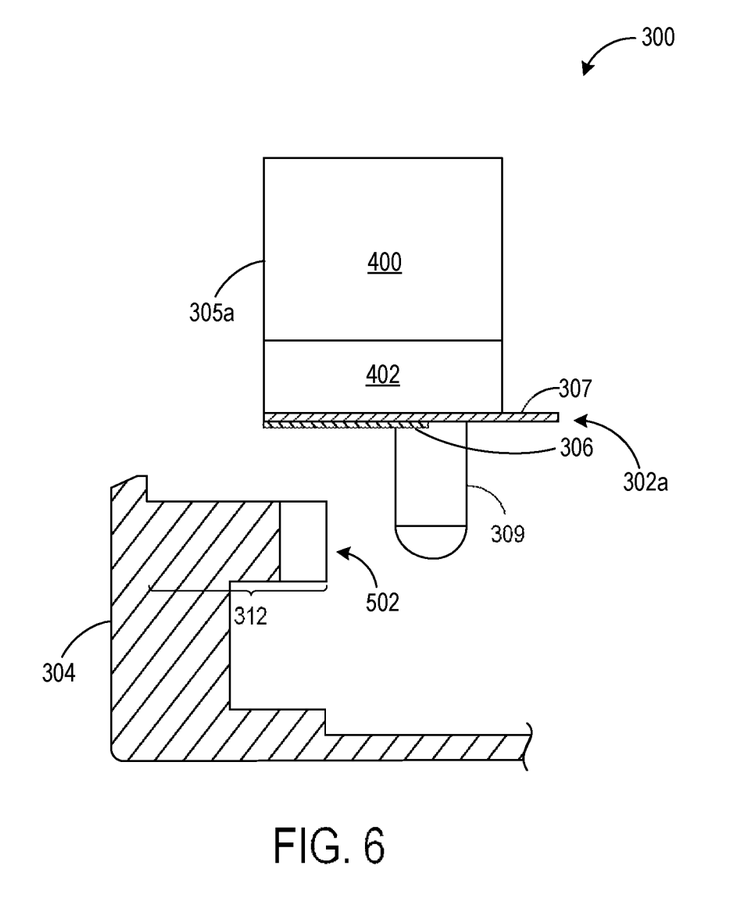
FIG. 6 shows a partial cross section taken along line 6-6 of FIG. 5.
Figure 7:
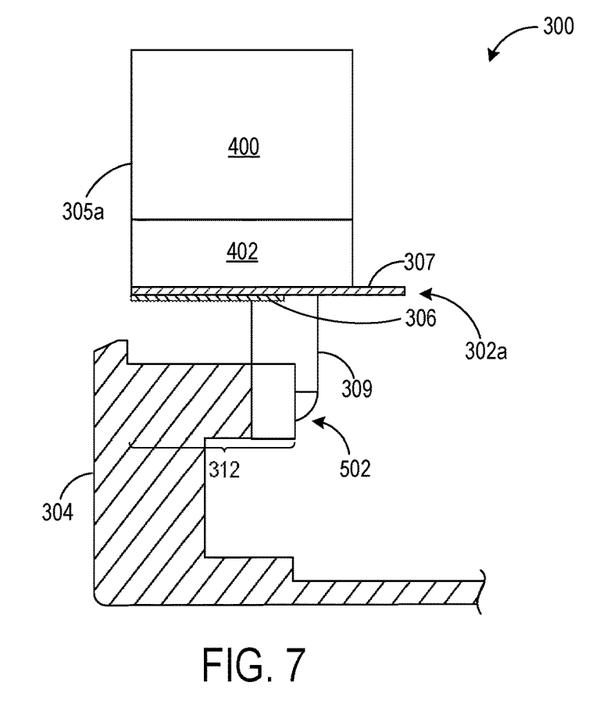
FIG. 7 shows a partial, side cross section of the pressure sensitive adhesive application fixture in a second, aligned position contacting the body.

FIG. 6 shows a partial cross-sectional view taken along line 6-6 of FIG. 5, illustrating a side view of the PSA application fixture 300 with the clamshell rotated closed but the PSA assembly 302a not yet aligned to the deck. This position may be referred to as a closed, unaligned position. In the depicted figure, the second index feature 309 has not yet been brought into contact with the second reference feature 502. Next, FIG. 7 shows a partial, side cross section of the PSA application fixture 300 in a closed, aligned position while contacting the body 304. Here, the second index feature 309 is shown as being positioned within and contacting the second reference feature 502. In this position, the PSA assembly 302a is properly aligned relative to the body 304, but not yet adhered to the body 304. The various components of the PSA application fixture 300 may be configured to move to the aligned configuration including but not limited via a servomechanism or spring bias.

Figure 8:
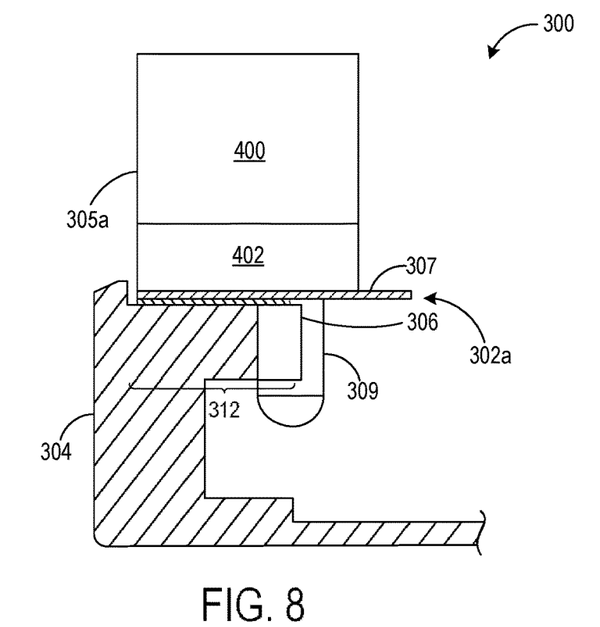
FIG. 8 shows a partial, side cross section of the example pressure sensitive adhesive application fixture of FIG. 3 in a third, engaged position adhering the pressures sensitive adhesive assembly to the body.

FIG. 8 shows a partial, side cross section of the PSA application fixture 300 in an aligned and engaged position, in which the PSA assembly 302a is adhered to the body 304. To bring these components into contact, the PSA application fixture 300 may lift the body 304 toward the PSA assembly 306 to make contact with the PSA 306, or may lower the PSA assembly 302a toward the body 304 to make contact.

Figure 9:
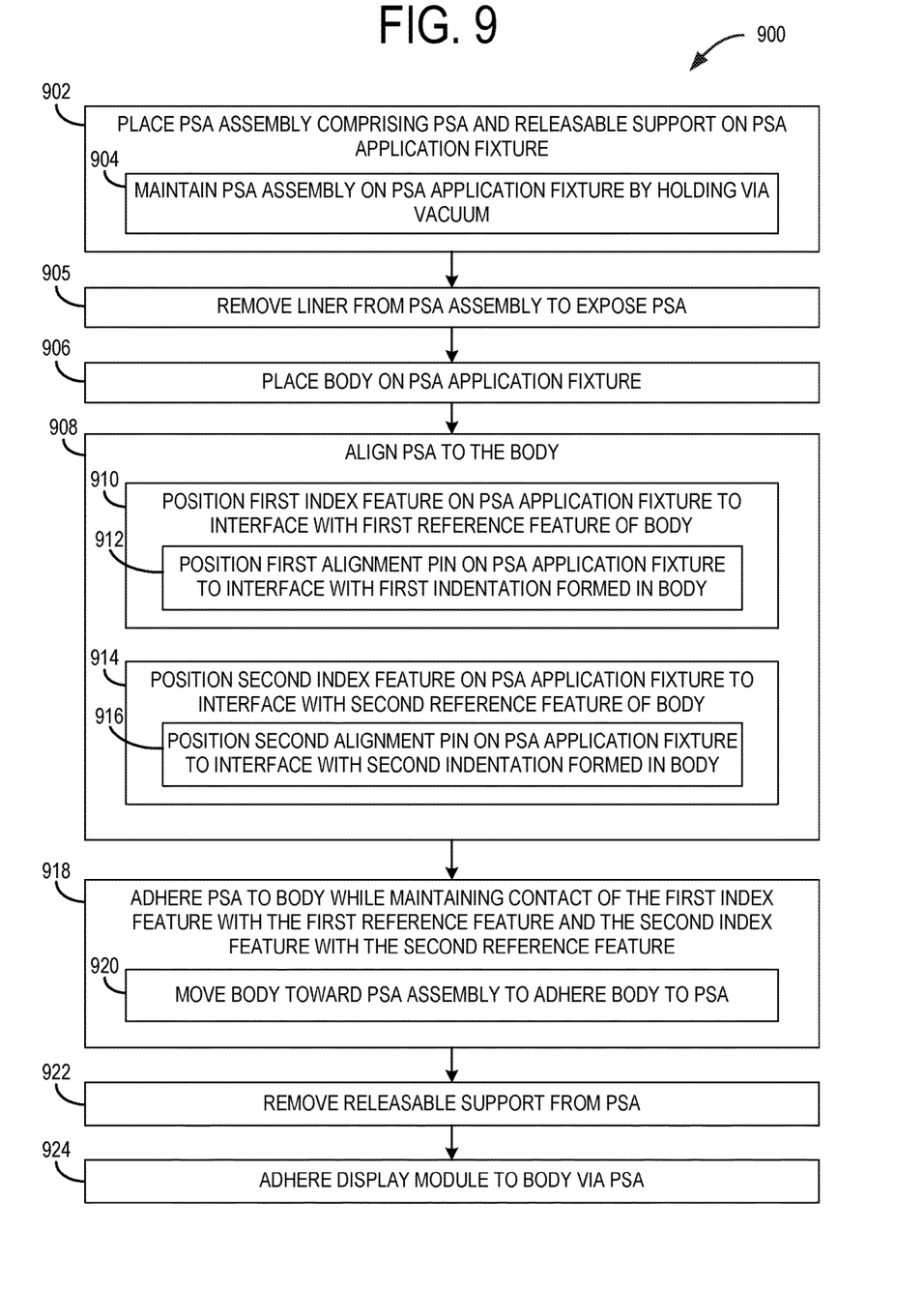
FIG. 9 shows an example method of adhering a pressure sensitive adhesive onto a body of a display device.

FIG. 9 is a flowchart illustrating an example method 900 of adhering a pressure sensitive adhesive onto a body of a display device. The method 900 includes, at 902, placing the PSA assembly comprising a PSA and a releasable support on a PSA application fixture, such as that described with regard to FIGS. 3, 4A, and 4B. The releasable support may be on a first side of the PSA, while an additional liner also may be provided on a second side of the PSA. As such, placing the PSA assembly on the PSA application fixture may include, at 904, maintaining the PSA assembly on the PSA application fixture via an applied vacuum such that the side having the releasable support faces the PSA application fixture. The method 900 then includes, at 905, removing the liner from the PSA assembly to expose the PSA. Next, the method 900 includes, at 906, placing a body of the display device on the PSA application fixture, and at 908, while maintaining the PSA assembly on the PSA application fixture, aligning a position of the PSA to the body. For example, the PSA may be aligned to the body by positioning a first index feature on the PSA application fixture to interface with a first reference feature of the body, at 910. As described above with regard to FIG. 5, this may include positioning a first alignment pin on the PSA application fixture to interface with a first indentation formed in the body, at 912. In some examples, the first reference feature may comprise an elongated indentation formed in an inner edge of a deck of the body, as shown in FIG. 5.

The PSA may be further aligned to the body by, at 914, positioning a second index feature on the PSA application fixture to interface with a second reference feature of the body. In some examples, this may include positioning a second alignment pin on the PSA application fixture to interface with a second indentation formed in the body, at 916. As examples, the second reference feature may be a semicircular indentation, an indentation comprising one or more angles, or any other suitably shaped indentation formed in the inner edge of the deck of the body that is shaped to accurately interface with a shape of the second index feature on the PSA application fixture.

The method 900 further includes, at 918, adhering the PSA to the body while maintaining contact of the first index feature with the first reference feature and the second index feature with the second reference feature. The PSA may be adhered to the body by moving the body toward to the PSA assembly, at 920, or by moving the PSA assembly toward the body. Once the PSA assembly has been adhered in an aligned position, the releasable support of the PSA assembly may be removed to expose an adhesive side of the PSA, at 922. The method 900 then includes adhering a display module to the body via the PSA, at 924.

In some embodiments, the methods and processes described herein may be tied to a computing system of one or more computing devices. In particular, such methods and processes may be implemented as a computer-application program or service, an application-programming interface (API), a library, and/or other computer-program product.

Figure 10:
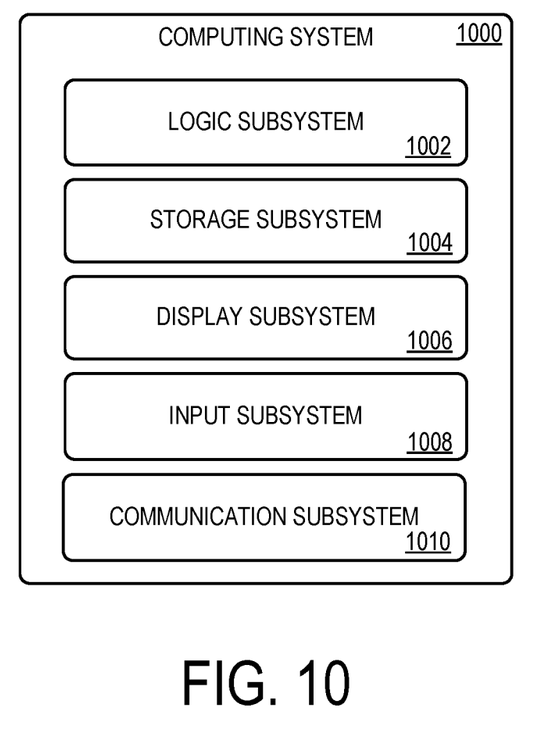
FIG. 10 shows a block diagram of an example computing system.

FIG. 10 shows a block diagram of an example computing system 1000 that can enact one or more of the methods and processes described above. The computing system 1000 is shown in simplified form. The computing system 1000 may take the form of one or more personal computers, server computers, tablet computers, home entertainment computers, network computing devices, gaming devices, mobile computing devices, mobile communication devices (e.g., smart phone), and/or other computing devices, such as computing system 314 to control the PSA application fixture 300.

The computing system 1000 includes a logic subsystem 1002 and a storage subsystem 1004. The computing system 1000 may optionally include a display subsystem 1006, input subsystem 1008, communication subsystem 1010, and/or other components not shown in FIG. 10.

The logic subsystem 1002 includes one or more physical devices configured to execute instructions. For example, the logic subsystem 1002 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic subsystem 1002 may include one or more processors configured to execute software instructions. Additionally or alternatively, the logic subsystem 1002 may include one or more hardware or firmware logic machines configured to execute hardware or firmware instructions. Processors of the logic subsystem 1002 may be single-core or multi-core, and the instructions executed thereon may be configured for sequential, parallel, and/or distributed processing. Individual components of the logic subsystem 1002 optionally may be distributed among two or more separate devices, which may be remotely located and/or configured for coordinated processing. Aspects of the logic subsystem 1002 may be virtualized and executed by remotely accessible, networked computing devices configured in a cloud-computing configuration.

The storage machine subsystem 1004 includes one or more physical devices configured to hold instructions executable by the logic subsystem 1002 to implement the methods and processes described herein. When such methods and processes are implemented, the state of the storage subsystem 1004 may be transformed—e.g., to hold different data.

The storage subsystem 1004 may include removable and/or built-in devices. The storage subsystem 1004 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. The storage subsystem 1004 may include volatile, nonvolatile, dynamic, static, read/write, read-only, random-access, sequential-access, location-addressable, file-addressable, and/or content-addressable devices. The storage subsystem 1004 comprises instructions stored thereon that are executable by the logic subsystem 1002, for example, to receive and interpret inputs from the sensors, to identify location and movements of a user, to identify real objects in an augmented reality field of view and present augmented reality imagery therefore, to detect objects located outside a field of view of the user, and to present indications of positional information associated with objects located outside the field of view of the user, among other tasks.

It will be appreciated that the storage subsystem 1004 includes one or more physical devices. However, aspects of the instructions described herein alternatively may be propagated by a communication medium (e.g., an electromagnetic signal, an optical signal, etc.) that is not held by a physical device for a finite duration.

Aspects of the logic subsystem 1002 and storage subsystem 1004 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The term "program" may be used to describe an aspect of computing system 800 implemented to perform a particular function. In some cases, a program may be instantiated via the logic subsystem 1002 executing instructions held by the storage subsystem 1004. It will be understood that different programs may be instantiated from the same application, service, code block, object, library, routine, API, function, etc. Likewise, the same program may be instantiated by different applications, services, code blocks, objects, routines, APIs, functions, etc. The term "program" may encompass individual or groups of executable files, data files, libraries, drivers, scripts, database records, etc.

It will be appreciated that a "service", as used herein, is an application program executable across multiple user sessions. A service may be available to one or more system components, programs, and/or other services. In some implementations, a service may run on one or more server-computing devices.

When included, the display subsystem 1006 may be used to present a visual representation of data held by the storage subsystem 1004. This visual representation may take the form of a graphical user interface (GUI). As the herein described methods and processes change the data held by the storage subsystem 1004, and thus transform the state of the storage machine, the state of the display subsystem 1006 may likewise be transformed to visually represent changes in the underlying data. The display subsystem 1006 may include one or more display devices utilizing virtually any type of technology. Such display devices may be combined with the logic subsystem 1002 and/or the storage subsystem 1004 in a shared enclosure, or such display devices may be peripheral display devices.

When included, the input subsystem 1008 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, the communication subsystem 1010 may be configured to communicatively couple computing system 1000 with one or more other computing devices. The communication subsystem 1010 may include wired and/or wireless communication devices compatible with one or more different communication protocols. As non-limiting examples, the communication subsystem 1010 may be configured for communication via a wireless telephone network, or a wired or wireless local- or wide-area network. In some embodiments, the communication subsystem 1010 may allow the computing system 1000 to send and/or receive messages to and/or from other devices via a network such as the Internet.

Another example provides an electronic display device comprising a body, the body comprising a wall and a deck extending inwardly from the wall, the deck comprising a first reference feature configured to interface with a first index feature on a pressure sensitive adhesive application fixture, and the deck also comprising a second reference feature configured to interface with a second index feature on the pressure sensitive adhesive application fixture, the electronic display device further comprising a display module supported by the deck, and a pressure sensitive adhesive adhering the display module to the deck. The pressure sensitive adhesive may be additionally or alternatively separated from an inner surface of the wall of the body by a gap of between 0.10 to 0.25 mm. The second reference feature may additionally or alternatively include an indentation in an inner edge of the deck. The pressure sensitive adhesive may additionally or alternatively include an inner edge with an indentation having a shape of the second reference feature. The indentation having a shape of the second reference feature may be additionally or alternatively semi-circular, and may additionally or alternatively include one or more angles. The first reference feature may additionally or alternatively include an elongated indentation in an inner edge of the deck. In this example, wherein the first reference feature and the second reference feature may each be on a first side of the deck, the electronic display device may additionally or alternatively include a second set of reference features on a second side of the deck.

Another example provides a device comprising a body, the body comprising a wall and a deck extending inwardly from the wall, the device further comprising a display module supported by the deck, and a pressure sensitive adhesive adhering the display module to the deck, the pressure sensitive adhesive being separated from the wall by a gap of between 0.15 to 0.25 mm. The pressure sensitive adhesive may additionally or alternatively be separated from the wall by a gap of between 0.10-0.2 mm. The deck may additionally or alternatively include a first reference feature configured to interface with a first index feature on a pressure sensitive adhesive application fixture. The deck may additionally or alternatively include a second reference feature configured to interface with a second index feature on a pressure sensitive adhesive application fixture. The device may additionally or alternatively include one or more of a tablet computing device, a laptop computing device, and a mobile computing device.

Another example provides a method of applying a pressure sensitive adhesive to a body of a display device configured to support a display module, the method comprising placing a pressure sensitive adhesive assembly comprising the pressure sensitive adhesive and a releasable support on a pressure sensitive adhesive application fixture, while maintaining the pressure sensitive adhesive assembly on the pressure sensitive adhesive application fixture, aligning a position of the pressure sensitive adhesive to the body by positioning a first index feature on the pressure sensitive adhesive application fixture to interface with a first reference feature of the body, and positioning a second index feature on the pressure sensitive adhesive application fixture to interface with a second reference feature on the body, and adhering the pressure sensitive adhesive to the body while maintaining contact of the first index feature with the first reference feature and the second index feature with the second reference feature. In this example, placing the pressure sensitive adhesive on a pressure sensitive adhesive application fixture may additionally or alternatively include inserting the first index feature on the pressure sensitive adhesive application fixture through a first hole in the pressure sensitive adhesive assembly and inserting the second index feature on the pressure sensitive adhesive application fixture through a second hole in the pressure sensitive adhesive assembly. Maintaining the pressure sensitive adhesive assembly on the pressure sensitive adhesive application fixture may additionally or alternatively include holding the pressure sensitive adhesive assembly on the pressure sensitive adhesive application fixture via a vacuum. Positioning the first index feature on the pressure sensitive adhesive application fixture to interface with the first reference feature of the body may additionally or alternatively include positioning a first alignment pin on the pressure sensitive adhesive application fixture to interface with the first reference feature, and positioning the second index feature on the pressure sensitive adhesive application fixture to interface with the second reference feature on the body may additionally or alternatively include positioning a second alignment pin to interface with the second reference feature. The method may additionally or alternatively include placing the body on the pressure sensitive adhesive application fixture, and adhering the pressure sensitive adhesive to the body may additionally or alternatively include moving the body toward the pressure sensitive adhesive assembly to adhere the body to the pressure sensitive adhesive after positioning the first index feature to interface with the first reference feature and positioning the second index feature to interface with the second reference feature. Positioning the first index feature on the pressure sensitive adhesive application fixture to interface with the first reference feature may additionally or alternatively include positioning the first index feature to interface with a first indentation formed in the body, and positioning the second index feature to interface with the second reference feature may additionally or alternatively include positioning the second index feature to interface with a second indentation formed in the body. The method may additionally or alternatively include adhering the display module to the pressure sensitive adhesive on the body.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method of applying a pressure sensitive adhesive to a body of a display device configured to support a display module, the method comprising:
    placing a pressure sensitive adhesive assembly comprising the pressure sensitive adhesive and a releasable support on a pressure sensitive adhesive application fixture;
    while maintaining the pressure sensitive adhesive assembly on the pressure sensitive adhesive application fixture, aligning a position of the pressure sensitive adhesive to the body of the display device by directly referencing features of the pressure sensitive adhesive application fixture to respective features of the body by
        positioning a first index feature of the pressure sensitive adhesive application fixture to directly reference and interface with a first reference feature of the body, and
        positioning a second index feature of the pressure sensitive adhesive application fixture to directly reference and interface with a second reference feature on the body; and
    adhering the pressure sensitive adhesive to the body while maintaining contact of the first index feature with the first reference feature and the second index feature with the second reference feature.

2. The method of claim 1, wherein placing the pressure sensitive adhesive on a pressure sensitive adhesive application fixture comprises inserting the first index feature on the pressure sensitive adhesive application fixture through a first hole in the pressure sensitive adhesive assembly and inserting the second index feature on the pressure sensitive adhesive application fixture through a second hole in the pressure sensitive adhesive assembly.

3. The method of claim 1, wherein maintaining the pressure sensitive adhesive assembly on the pressure sensitive adhesive application fixture comprises holding the pressure sensitive adhesive assembly on the pressure sensitive adhesive application fixture via a vacuum.

4. The method of claim 1, wherein the body of the device comprises a deck extending inwardly from the wall, and wherein positioning the first index feature on the pressure sensitive adhesive application fixture to interface with the first reference feature of the body comprises positioning a first alignment pin on the pressure sensitive adhesive application fixture to interface with a first indentation in an inner edge of the deck, and wherein positioning the second index feature on the pressure sensitive adhesive application fixture to interface with the second reference feature on the body comprises positioning a second alignment pin to interface with a second indentation in the inner edge of the deck.

5. The method of claim 1, further comprising placing the body on the pressure sensitive adhesive application fixture, and wherein adhering the pressure sensitive adhesive to the body comprises moving the body toward the pressure sensitive adhesive assembly to adhere the body to the pressure sensitive adhesive after positioning the first index feature to interface with the first reference feature and positioning the second index feature to interface with the second reference feature.

6. The method of claim 1, wherein positioning the first index feature on the pressure sensitive adhesive application fixture to interface with the first reference feature comprises positioning the first index feature to interface with a first indentation formed in the body, and wherein positioning the second index feature to interface with the second reference feature comprises positioning the second index feature to interface with a second indentation formed in the body.

7. The method of claim 1, further comprising adhering the display module to the pressure sensitive adhesive on the body.

* * * * *